US006946190B2

(12) United States Patent
Bunyan

(10) Patent No.: US 6,946,190 B2
(45) Date of Patent: *Sep. 20, 2005

(54) THERMAL MANAGEMENT MATERIALS

(75) Inventor: Michael H. Bunyan, Chelmsford, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/436,764

(22) Filed: May 13, 2003

(65) Prior Publication Data

US 2003/0203188 A1 Oct. 30, 2003

Related U.S. Application Data

(63) Continuation-in-part of application No. 10/277,970, filed on Oct. 21, 2002.
(60) Provisional application No. 60/354,810, filed on Feb. 6, 2002.

(51) Int. Cl.$^7$ .............................. B32B 5/16; B32B 9/04; B32B 5/00
(52) U.S. Cl. .................. 428/334; 428/220; 428/323; 428/328; 428/329; 428/330; 428/332; 428/340; 428/447; 428/484.4; 428/923; 428/926
(58) Field of Search ................................ 428/220, 323, 428/328, 329, 330, 332, 334, 340, 447, 484.1, 923, 926, 484

(56) References Cited

U.S. PATENT DOCUMENTS

| | | | |
|---|---|---|---|
| 2,311,526 A | 2/1943 | Farguson et al. ............. 524/62 |
| 3,332,055 A | 7/1967 | Bogner ........................ 439/88 |
| 3,405,066 A | 10/1968 | McGlee ....................... 336/94 |
| 3,609,104 A | 9/1971 | Ehrreich et al. ............ 252/511 |
| 3,928,907 A | 12/1975 | Chisholm .................. 29/527.4 |
| 4,217,320 A | 8/1980 | Ezis et al. .................... 264/85 |
| 4,299,715 A | 11/1981 | Whitfield et al. ............ 252/74 |
| 4,384,610 A | 5/1983 | Cook et al. .................. 172/667 |
| 4,389,340 A | 6/1983 | Levy .......................... 252/512 |
| 4,466,483 A | 8/1984 | Whitfield et al. ........... 165/185 |
| 4,473,113 A | 9/1984 | Whitfield et al. ........... 165/185 |
| 4,487,856 A | 12/1984 | Anderson et al. ........... 523/205 |
| 4,515,740 A | 5/1985 | Schuettenberg et al. ...... 264/50 |
| 4,533,685 A | 8/1985 | Hudgin et al. .............. 523/457 |
| 4,546,411 A | 10/1985 | Kaufman .................... 361/705 |
| 4,561,011 A | 12/1985 | Kohara et al. .............. 257/713 |
| 4,575,432 A | 3/1986 | Lin et al. .................... 252/511 |
| 4,602,678 A | 7/1986 | Fick ............................. 165/79 |
| 4,654,754 A | 3/1987 | Daszkowski ................ 361/708 |
| 4,685,987 A | 8/1987 | Fick ............................ 156/247 |
| 4,722,960 A | 2/1988 | Dunn et al. .................. 524/430 |
| 4,755,249 A | 7/1988 | DeGree et al. ............. 156/252 |
| 4,764,845 A | 8/1988 | Artus ........................... 361/705 |
| 4,782,893 A | 11/1988 | Thomas ...................... 165/185 |
| 4,842,911 A | 6/1989 | Fick ............................ 428/40.4 |
| 4,855,002 A | 8/1989 | Dunn et al. ............... 156/307.3 |
| 4,869,954 A | 9/1989 | Squitieri ....................... 442/13 |
| 4,915,167 A | 4/1990 | Altoz ........................... 165/185 |
| 4,965,699 A | 10/1990 | Jorden et al. ............... 361/706 |
| 4,974,119 A | 11/1990 | Martin ......................... 361/56 |
| 4,979,074 A | 12/1990 | Morley et al. .............. 165/185 |
| 5,052,481 A | 10/1991 | Horvath et al. ............. 361/706 |
| 5,060,114 A | 10/1991 | Feinberg et al. ............ 428/209 |
| 5,061,549 A | 10/1991 | Shores ........................ 524/430 |
| 5,062,896 A | * 11/1991 | Huang et al. .......... 106/287.19 |
| 5,094,769 A | 3/1992 | Anderson, Jr. et al. ....... 252/74 |
| 5,137,959 A | 8/1992 | Block et al. ................... 252/74 |
| 5,167,851 A | 12/1992 | Jamison et al. ........... 228/123.1 |
| 5,170,930 A | 12/1992 | Dolbear et al. ............. 524/404 |
| 5,194,480 A | 3/1993 | Block et al. ................. 428/131 |
| 5,213,704 A | 5/1993 | Anderson, Jr. et al. ....... 252/75 |
| 5,213,868 A | 5/1993 | Liberty et al. .............. 420/577 |
| 5,248,476 A | 9/1993 | Slattery et al. ............... 252/74 |
| 5,250,209 A | 10/1993 | Jamison et al. .............. 252/74 |
| 5,291,372 A | 3/1994 | Matsumoto ................. 361/710 |
| 5,298,791 A | 3/1994 | Liberty et al. .............. 251/707 |
| 5,302,344 A | 4/1994 | Perlman ...................... 422/26 |
| 5,321,882 A | 6/1994 | Zarouri et al. ........... 29/603.07 |
| 5,328,087 A | 7/1994 | Nelson et al. .............. 228/175 |
| 5,352,731 A | 10/1994 | Nakano et al. ............. 524/786 |
| 5,372,883 A | 12/1994 | Shores ........................ 428/323 |

(Continued)

FOREIGN PATENT DOCUMENTS

| | | |
|---|---|---|
| EP | 1 143 511 A2 | 10/2001 |
| EP | 1 143 512 A2 | 10/2001 |
| EP | 1 291 913 A2 | 3/2003 |
| JP | 5-138396 | 6/1993 |
| WO | 96/37915 | 11/1996 |
| WO | 00/36893 | 6/2000 |

OTHER PUBLICATIONS

International Application Published Under the Patent Cooperation Treaty No. WO 96/37915.
International Application Published Under the Patent Cooperation Treaty No. WO 97/41599.
Article entitled Thermally Conductive Adhesives for Electronic Packaging, authored by Carol Latham, President of Thermagon, Inc. dated Jul. 1991.

(Continued)

*Primary Examiner*—Sheeba Ahmed
(74) *Attorney, Agent, or Firm*—John A. Molnar, Jr.

(57) ABSTRACT

A thermally-conductive compound for forming a layer which is conformable between a first heat transfer surface and an opposing second heat transfer surface to provide a thermal pathway therebetween. The compound is an admixture of a thermal grease component and a dispersed constituent forming discrete domains within the grease component, the domains being form-stable at normal room temperature in a first phase and conformable between the first and second heat transfer surface in a second phase, and the domains having a domain transition temperature above normal room temperature from the first phase to the second phase. The dispersed constituent may be a fusible, i.e., low temperature melting, metal or metal alloy.

28 Claims, 4 Drawing Sheets

U.S. PATENT DOCUMENTS

| | | | |
|---|---|---|---|
| 5,445,308 A | 8/1995 | Nelson et al. ............... 228/121 |
| 5,471,027 A | 11/1995 | Call et al. ................. 219/85.13 |
| 5,533,256 A | 7/1996 | Call et al. ...................... 29/840 |
| 5,545,473 A | 8/1996 | Ameen et al. ............... 428/212 |
| 5,580,520 A | 12/1996 | Slattery et al. ............. 420/557 |
| 5,602,221 A | 2/1997 | Bennett et al. .......... 526/307.7 |
| 5,679,457 A | 10/1997 | Bergerson ................... 428/344 |
| 5,770,318 A | 6/1998 | Friedman .................... 428/500 |
| 5,781,412 A | 7/1998 | de Sorgo .................... 361/704 |
| 5,783,862 A | 7/1998 | Deeney ...................... 257/714 |
| 5,796,582 A | 8/1998 | Katchmar ................... 361/704 |
| 5,798,171 A | 8/1998 | Olson ......................... 428/220 |
| 5,930,893 A | 8/1999 | Eaton ...................... 29/890.03 |
| 5,944,322 A | 8/1999 | Coff et al. ................... 277/594 |
| 5,945,217 A * | 8/1999 | Hanrahan ................... 428/389 |
| 5,950,066 A | 9/1999 | Hanson et al. ............... 428/551 |
| 5,994,020 A | 11/1999 | Patel et al. ............ 430/137.14 |
| 6,037,658 A | 3/2000 | Brodsky et al. ............ 257/707 |
| 6,054,198 A | 4/2000 | Bunyan et al. ............ 428/40.5 |
| 6,080,800 A | 6/2000 | Frey et al. ................... 521/132 |
| 6,090,484 A | 7/2000 | Bergerson ............. 428/355 EN |
| 6,197,859 B1 | 3/2001 | Green et al. ................ 524/270 |
| 6,339,120 B1 | 1/2002 | Misra et al. ................ 524/404 |
| 6,339,130 B1 | 1/2002 | Bennett et al. ............. 525/415 |
| 6,372,997 B1 | 4/2002 | Hill et al. .................... 174/252 |
| 6,391,442 B1 | 5/2002 | Duvall et al. ............... 428/348 |
| 6,523,608 B1 | 2/2003 | Solbrekken et al. |

OTHER PUBLICATIONS

Letter dated Jul. 25, 2000 from Eugen Lieberstein of Anderson Kill & Olick, P.C.

Invoices dated May 15, 1992 and Jul. 6, 1993 of Thermagon, Inc.

Technical Data Sheet Ablefilm® 5025E, dated Mar., 1992 of Ablestik, entitled Electrically Conductive Adhesive Flm.

Technical Data Sheet Ablefilm® 563K, dated Nov., 1995 of Ablestik, entitled Thermally Conductive Adhesive Film.

Technical Data Sheet Ablefilm® 566K, dated Nov., 1995 of Ablestik, entitled Low Temperature Cure Adhesive Film.

Article entitled T–gon 100 Series, Thermally Conducitve Epoxy Adhesive Films, dated Jun. 10, 1997 of Thermegon, Inc.

AI Technology Data Sheet for Cool–Pad TP7105, revised Feb., 1992.

AI Technology Data Sheet for Cool–Pad TP7608, revised Feb., 1992.

AI Technology Data Sheet for Cool–Pad TP7208, revised Feb., 1992.

AI Technology Data Sheet for Cool–Paid TP7205, revised Feb., 192

AI Technology Data Sheet for Thermoplastic TP7165, revised Oct., 1994.

AI Technology Data Sheet for Cool–Pad TP7605, revised Oct., 1994.

AI Technology Data Sheet for Cool–Pad TP7609, revised Aug. 12, 2000.

Article authored by L.M. Leung and K. K. T. Chung entitled Zero–Stress Film Adhesive for Substrate Attach, published in Hybrid Circuits No. 18, Jan. 1989.

Letter dated Aug. 17, 2000 from Clement A. Berard of Dann, Dorfman, Herrell & Skillman.

Thermal Products Group—Grease Replacement Products To Support Pentium and Pentium II Applications Sep. 16, 1998.

IBM Technical Disclosure Bulletin, vol. 25, No. 11A Apr. 1983 Flexible Heat–Conducting Sheet Material For Semiconductor Packages, R. H. Lacombe and H. Lee.

IBM Technical Disclosure Bulletin, vol. 24, No. 12 May 1982 Chip Cooling Employing Alloys Having Different Solidus Temperatures, J. K. Hassan, S. Oktay and J. Paivannas.

IBM Technical Disclosure Bulletin, vol. 27, No. 7A Dec. 1984 Cooling Assembly For Solder–Bonded Semiconductor Devices—J. L. Horvath.

IBM Technical Disclosure Bulletin, vol. 35, No. 7 Dec. 1992 Thermally Conductive, Reworkable, Elastomeric Interposer For Chip–to–Heat Sink Attachment.

AI Technology Invoice No. 6420 dated Feb. 12, 1993.

AI Technology Invoice No. 7344 dated Aug. 27, 1993.

AI Technology Invoice No. 5657 dated Sep. 14, 1992.

AI Technology Invoice No. 4580 dated Mar.24, 1993.

AI Technology Invoice No. 5370 dated Jul. 27, 1992.

AI Technology Invoice No. 4964 dated May 27, 1992.

AI Technology Invoice No. 8303 dated Mar. 18, 1994.

AI Technology Invoice No. 8789 dated Jul. 18, 1994.

ORCUS inc. THERMAPHASE—Thermal Interface Materials for Electronics: Unique Characteristics, Lowest Thermal Resistance.

Technical Bulletin #77 Chomerics—CHO–THERM Thermal Interface Materials 1997.

Technical Bulletin #78 Chomerics—CHO–THERM Thermal Interface Materials 1998.

*Packaging Ideas*, Edited by Howard Markstein, Interface Materials Offer Heat Transfer and Isolation.

Earl's Pressure Master—Engine Gaskets Seals—1996 Earl's Performance Products.

Unisys System Technology Operations ThEn Foam Constituents and Application Guide.

Alchemy Fusible Alloys dated Mar.1, 2001.

Standard Specification for Low Melting Point Alloys, Designation: B 774–00.

Chomerics' Test Report—Comparison of Thermal Grease and Thermflow® T707/T710 on a Leading Manufacture's Tower PC.

Chomerics' Test Report—Typical Application Test Results for Thermflow® T725 Material, dated Jan. 5, 2000.

Chomerics' Thermflow® T725 Material Application Guidelines.

Chomerics' Preliminary Product Data Sheet for Thermflow™ T766.

Chomerics' Technical Bulletin 77 for Thermflow™ Low Thermal Phase Resistace Phase–Change Interface Pads, dated 1999.

Bergguist Hi–Flow™—The Grease Replacement Material With Thermal Resistance Equal to Grease—dated Jul. 6, 2001.

Thermaflow™ Phase–Change Materials dated Oct., 1999.

Dow Corning Product Information for Thermally Conductive Materials © 2000,2001.

AI Technology Data Sheet for Cool–Pad TP7105, revised Feb. 1992.

AI Technology Data Sheet for Cool–Pad TP7208, revised Feb. 1992.

AI Technology Data Sheet for Cool–Paid TP7205, revised Feb. 1992.

AI Technology Data Sheet for Cool–Pad TP7608, revised Feb. 1992.

Article authored by L.M Leung and K. K. T. Chung entitled Zero–stress Film Adhesive for Substrate Attach, published in Hybrid Circuits No. 18, Jan. 1989.

AI Technology Data Sheet for Thermoplastic TP7165, revised Oct. 1994.

AI Technolgy Data Sheet for Cool–Pad TP7605, revised Oct., 1994.

Material Safety Data MSDS No. 320—CSL 850 Heat Sink Compound—revised May 12, 2000.

CSL Silicones, Inc., CSL–850 Technical Data Sheet o 1999.

CHO–LUBE® Electrically Conductive Grease, Applicants request the Examiner to Consider this reference as prio art under 102(a), However, Applicants respectfully reserve the right to supplement this Information Disclosure Statement and take a contrary position should it be necessary.

International Search Report in PCT Application No. PCT/IB97/00223.

* cited by examiner

THERMAL MANAGEMENT MATERIALS

CROSS-REFERENCE TO RELATED APPLICATION

This application is a continuation-in-part of U.S. application Ser. No. 10/277,970, entitled "Thermal Management Materials Having A Phase Change Dispersion," filed Oct. 21, 2002, and claiming priority to U.S. provisional application Ser. No. 60/354,810, filed Feb. 6, 2002, the disclosure of each of which is expressly incorporated herein by reference.

BACKGROUND OF THE INVENTION

The present invention relates broadly to thermal management materials for electronic devices. Such materials commonly are used as heat transfer interfaces between, for example, the mating heat transfer surfaces of a heat-generating, electronic component, such as an integrated circuit (IC) chip, and a thermal dissipation member, such as a heat sink or spreader, for the conductive cooling of the electronic component. More particularly, the present invention relates to a thermally-conductive interface material which is formed as an admixture of a continuous phase constituent and a dispersed phase constituent which is provided to be solid, semi-solid or otherwise form-stable in a first state at normal room temperature but conformable with the continuous phase constituent in a second state within the operating temperature of the electronic component to provide an enhanced low thermal impedance interface between the component and the dissipation member.

Circuit designs for modern electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

As electronic components have become smaller and more densely packed on integrated boards and chips, designers and manufacturers now are faced with the challenge of how to dissipate the heat which is ohmicly or otherwise generated by these components. Indeed, it is well known that many electronic components, and especially power semiconductor components such as transistors and microprocessors, are more prone to failure or malfunction at high temperatures. Thus, the ability to dissipate heat often is a limiting factor on the performance of the component.

Electronic components within integrated circuits traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components.

Heat dissipation beyond that which is attainable by simple air circulation may be effected by the direct mounting of the electronic component to a thermal dissipation member such as a "cold plate" or other heat sink or spreader. The dissipation member may be a dedicated, thermally-conductive ceramic or metal plate or finned structure, or simply the chassis or circuit board of the device. However, beyond the normal temperature gradients between the electronic component and the dissipation member, an appreciable temperature gradient is developed as a thermal interfacial impedance or contact resistance at the interface between the bodies.

That is, and as is described in U.S. Pat. No. 4,869,954, the faying thermal interface surfaces of the component and heat sink typically are irregular, either on a gross or a microscopic scale. When the interfaces surfaces are mated, pockets or void spaces are developed therebetween in which air may become entrapped. These pockets reduce the overall surface area contact within the interface which, in turn, reduces the heat transfer area and the overall efficiency of the heat transfer through the interface. Moreover, as it is well known that air is a relatively poor thermal conductor, the presence of air pockets within the interface reduces the rate of thermal transfer through the interface.

To improve the heat transfer efficiency through the interface, a pad or other layer of a thermally-conductive, electrically-insulating material typically is interposed between the heat sink and electronic component to fill in any surface irregularities and eliminate air pockets. Initially employed for this purpose were materials such as silicone grease or wax filled with a thermally-conductive filler such as aluminum oxide. Such materials usually are semi-liquid or solid at normal room temperature, but may liquefy or soften at elevated temperatures to flow and better conform to the irregularities of the interface surfaces.

Alternatively, another approach is to substitute a cured, sheet-like material in place of the silicone grease or wax. Such materials may be compounded as containing one or more thermally-conductive particulate fillers dispersed within a polymeric binder, and may be provided in the form of cured sheets, tapes, pads, or films. Typical binder materials include silicones, urethanes, thermoplastic rubbers, and other elastomers, with typical fillers including aluminum oxide, magnesium oxide, zinc oxide, boron nitride, and aluminum nitride.

Exemplary of the aforesaid interface materials is an alumina or boron nitride-filled silicone or urethane elastomer which is marketed under the name CHO-THERM® by the Chomerics TEC Division of Parker-Hannifin Corp., 16 Flagstone Drive, Hudson, N.H. 03051. Additionally, U.S. Pat. No. 4,869,954 discloses a cured, form-stable, sheet-like, thermally-conductive material for transferring thermal energy. The material is formed of a urethane binder, a curing agent, and one or more thermally conductive fillers. The fillers, which may include aluminum oxide, aluminum nitride, boron nitride, magnesium oxide, or zinc oxide, range in particle size from about 1–50 microns (0.05–2 mils).

Sheets, pads, and tapes of the above-described types have garnered general acceptance for use as interface materials in the conductive cooling of electronic component assemblies such as the semiconductor chips, i.e., dies, described in U.S. Pat. No. 5,359,768. In certain applications, however, heavy fastening elements such as springs, clamps, and the like are required to apply enough force to conform these materials to the interface surfaces in order to attain enough surface for efficient thermal transfer. Indeed, for some applications, materials such as greases and waxes which liquefy, melt, or soften at elevated temperature continue to be preferred as better conforming to the interface surfaces under relatively low clamping pressures.

Recently, phase-change materials ("PCM") have been introduced which are self-supporting and form-stable at room temperature for ease of handling, but which liquefy or otherwise soften at temperatures within the operating temperature range of the electronic component to form a viscous, thixotropic phase which better conforms to the interface surfaces. These phase-change materials, which may be supplied as free-standing films, or as heated screen printed onto a substrate surface, advantageously function much like greases and waxes in conformably flowing within the operating temperature of the component under relatively low clamping pressures of about 5 psi (35 kPa). Such materials are further described in commonly-assigned U.S. Pat. No. 6,054,198, and in the commonly-assigned publications US 20020135984, WO0036893, and WO02059965, and U.S. application Ser. No. 10/277,970, filed Oct. 21, 2002, entitled "Thermal Management Materials Having A Phase Change Dispersion." Such materials are marketed commercially under the names THERMFLOW® T310, T443, T705, T710, T725, and A725 by the Chomerics Division of Parker-Hannifin Corp., 16 Flagstone Drive, Hudson, N.H. 03051. Other phase-change materials are shown in U.S. Pat. No. 6,391,442, and are marketed commercially by the Bergquist Company (Minneapolis, Minn.) under the tradename "HI-FLOW™," by Thermagon, Inc. (Cleveland, Ohio) under the tradename "T-PCM™," and by Orcus, Inc. (Stilwell, Kans.) under the tradename "THERMAPHASE." A phase-change material/metal foil laminate is marketed by Thermagon, Inc. under the tradename "T-MATE™."

For typical commercial application, the thermal interface material may be supplied in the form of a tape or sheet which includes an inner and outer release liner and an interlayer of thermal compound. Unless the thermal compound is inherently tacky, one side of the compound layer may be coated with a thin layer of a pressure-sensitive adhesive (PSA) for the application of the compound to the heat transfer surface of a heat sink. In order to facilitate automated dispensing and application, the outer release liner and compound interlayer of the tape or sheet may be die cut to form a series of individual, pre-sized pads. Each pad thus may be removed from the inner release liner and bonded to the heat sink using the adhesive layer in a conventional "peel and stick" application which may be performed by the heat sink manufacturer.

With the pad being adhered to the heat transfer surface of the thermal dissipation member such as a heat sink or spreader, and with the outer liner in place to form a protective cover the outer surface of the compound layer, the dissipation member and pad may be provided as an integrated assembly. Prior to installation of the assembly, the outer release liner is removed from the compound layer, and the pad positioned on the electronic component. A clamp may be used to secure the assembly in place.

Other materials, as exemplified in U.S. Pat. No. 5,467,251, and in commonly-assigned U.S. Pat. No. 5,781,412, and as marketed commercially by the Chomerics Division of Parker-Hannifin Corp. under the name "THERM-A-FORM™," are commonly referred to as thermal interface compounds, caulks, form-in-place materials, or encapsulants. These materials typically are supplied as charged within one or more tubes, containers, and the like as, most often, one or two-part liquid or otherwise fluent, filled reactive systems which cure at room or elevated temperatures to be formed-in-place within the gap or component to which the compound is applied. Application may be cartridge or tube guns or other dispensing systems.

In view of the foregoing, it will be appreciated that further improvements in thermal management materials would be well-received by electronics manufacturers.

BROAD STATEMENT OF THE INVENTION

The present invention is directed to a thermally-conductive interface, and a material therefor, for a thermal management assembly involving, for example, a heat source such as an electronic chip or other heat-generating component and a thermal dissipation member such as a heat sink or spreader disposable in thermal adjacency with the electronic component for the conduction of heat therebetween. Particularly, the invention is directed to a material in the form of a thermally-conductive compound which may be provided as a sheet or pad, and/or which may be dispensable, such under an applied pressure as issued as a bead or mass from a nozzle or other orifice, for forming an interlayer which is compliant or otherwise conformable between the interfacing surfaces of the electronic component and the heat sink or spreader to provide a low thermal impedance across the assembly, and which affords lower thermal impedance for improved heat transfer performance.

Heretofore, materials of the type herein involved, and particularly those of a phase change variety, conventionally were formulated as a blend of a resin or wax binder and a thermally-conductive, particulate filler which may be one or more metal powders or metal or non-metal nitrides or oxides. Such fillers have a fixed particle size within the material such that the maximum particle size thereof defines the minimum thickness of the material within the interface formed between the respective surfaces of the assembly. Advantageously, it has been observed that by utilizing a thermally-conductive, a phase change material ("PCM") which forms a dispersed phase within a continuous phase of one or more polymeric materials, a thermal interface compound may be formulated which is highly conformable for lower contact resistance, and which the minimum thickness thereof within an interface or bondline need not be determined by the maximum particle size of a filler.

In an illustrative embodiment, the thermally-conductive compound of the present invention is formulated as an admixture of a non-curing thermal grease, which may be a paste or paste-like in consistency, and a fusible, i.e., low temperature melting, metal component. The grease may be based on a silicone fluid, or on another fluid or oil such as a mineral or hydrocarbon oil., and may contain one or more thermally-conductive particulate fillers. The metal component may be formulated as a mixture of one or more fusible metals, one or more fusible metal alloys, or a blend of one or more fusible metals and one or more fusible metal alloys. The fusible metal component is selected to be form-stable at normal room temperature in a first phase or state, and conformable within the interface in a second phase or state, and as having a transition temperature, such as a melting point ($T_m$) or glass transition ($T_g$) in the case of the polymeric component, and a melting point, solidus, or liquidus in the case of the fusible metal component, or a transition temperature range from the first phase to the second phase which is within the operating temperature range of the electronic component, and typically between about 40–100° C.

Advantageously, the fusible metals and/or alloys herein involved exhibit thermal conductivities on the order of about 20 W/m-K or more which are comparable to those exhibited by conventional metal powder particulate fillers. Moreover, within the interface or bondline, such metals and alloys also are conformable with the thermal grease such that the minimum thickness of the interface material need not be limited by the size of the fusible metal. Further, by virtue of the use of a thermal grease which remains viscous at room temperature, a relatively thin minimum bondline thickness ("MBLT") may be achieved under relatively low applied pressures and at room temperature, with the MBLT becoming even thinner in service as the fusible metal changes phase upon the powering of the electronic component.

The present invention, accordingly, comprises the combination of elements which are exemplified in the detailed disclosure to follow. Advantages of the present invention include a thermal interface material which is fully conformable for lowered contact resistance and more efficient heat transfer. Further advantages include a thermal interface material which may be formulated for use in applications requiring thin minimum bondline thicknesses ("MBLT"), but which as also specifying a material having high bulk thermal properties. Still further advantages include a thermal interface material which may be supplied in a sheet, tape, or pad, or in a syringe, gun, or other dispensable form.

BRIEF DESCRIPTION OF THE DRAWINGS

For a fuller understanding of the nature and objects of the invention, reference should be had to the following detailed description taken in connection with the accompanying drawings wherein.

Figure 1:
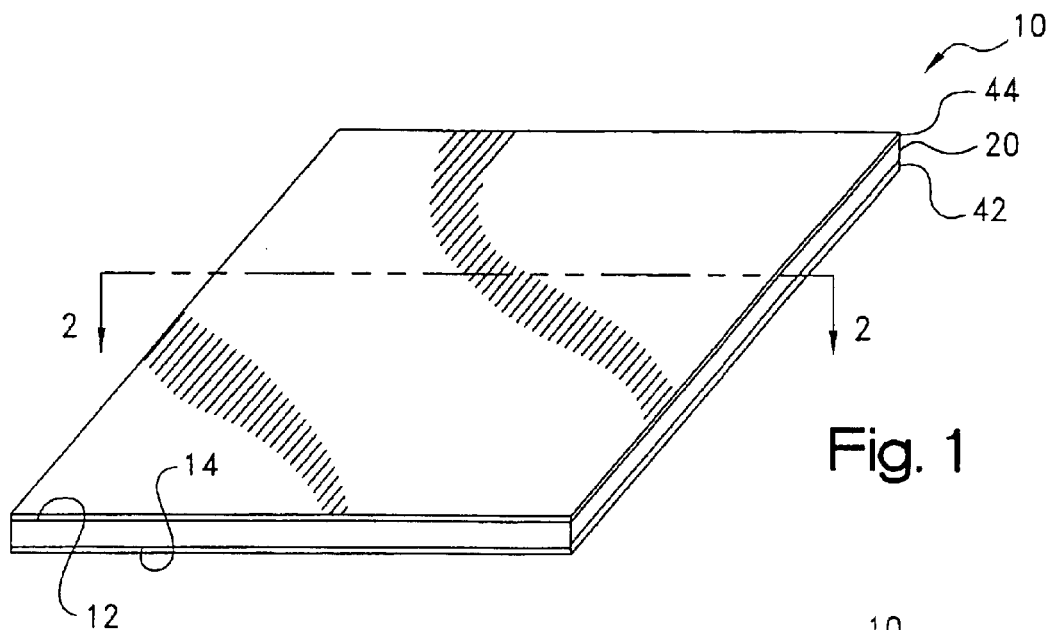
FIG. 1 is a perspective view of a representative thermal interface pad having a conformable layer of a thermally-conductive compound formulated in accordance with the present invention.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "interior," "inner," or "inboard" and "outward," "exterior," "outer," or "outboard" referring, respectively, to directions toward and away from the center of the referenced element, and the terms "radial" or "horizontal" and "axial" or "vertical" referring, respectively, to directions, axes, planes perpendicular and parallel to the central longitudinal axis of the referenced element. Terminology of similar import other than the words specifically mentioned above likewise is to be considered as being used for purposes of convenience rather than in any limiting sense. Also as used herein, "state change" may be used interchangeably with "phase change" to avoid confusion with the description of separate material phases, such as a continuous and a dispersed phase, within a compound or layer thereof.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the illustrative purposes of the discourse to follow, the thermally-conductive interface and material therefor of the invention herein involved is described in connection with its use within a thermal management assembly as a pad, which may be die or kiss-cut from a sheet or roll, which is adhered to a heat transfer surface of a thermal dissipation member such as a heat sink for heat transfer contact with a mating heat transfer surface of a electronic component. Such assemblies and thermal interface materials therefor are elsewhere described in U.S. Pat. Nos. 6,096,414; 6,054,198; 5,798,171; 5,766,740; 5,679,457; 5,545,473; 5,533,256; 5,510,174; 5,471,027; 5,359,768; 5,321,582; 5,309,320; 5,298,791; 5,250,209; 5,213,868; 5,194,480; 5,137,959; 5,167,851; 5,151,777; 5,060,114; 4,979,074; 4,974,119; 4,965,699; 4,869,954; 4,842,911; 4,782,893; 4,764,845; 4,685,987; 4,654,754; 4,606,962; 4,602,678; 4,473,113; 4,466,483; 4,299,715; and 3,928,907. It will be appreciated, however, that aspects of the present invention, which alternatively may be provided in other roll, sheet, film, or layer form such as a tape, may find use in other thermal management applications. The material of the invention also may be liquid dispensed or otherwise applied in a layer or pattern onto one of the heat transfer surfaces by direct or indirect means such as spraying, knife, roller, drum or other coating, brushing, casting, dipping, extrusion, screen, transfer, or other printing, and the like. Such uses and applications therefore should be considered to be expressly within the scope of the present invention.

Figure 2:
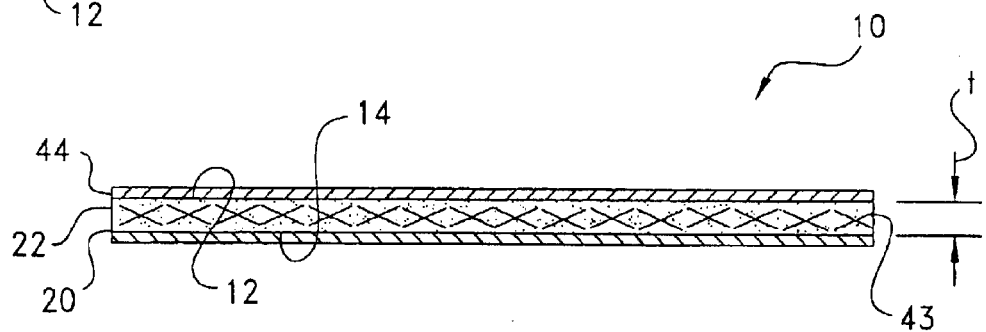
FIG. 2 is a cross-sectional view of the thermal interface pad of FIG. 1 taken through line 2—2 of FIG. 1.

Referring then to the figures wherein corresponding reference characters are used to designate corresponding elements throughout the several views with equivalent elements being referenced with prime or sequential alphanumeric designations, a representative thermally-conductive interface pad in accordance with the present invention is shown generally at 10 in perspective in FIG. 1 and in cross-section in FIG. 2. Within a thermal management assembly, pad 10 is interposable intermediate, for example, a pair of opposing heat transfer surfaces, such as from a heat sink or spreader and a heat-generating electronic component (see FIG. 6) to provide a low impedance, thermally-conductive pathway therebetween. In this regard, a first interface surface, referenced generally at 12, of pad 10 is disposable in conductive heat transfer contact or adjacency with one of the heat transfer surfaces, with an opposing second interface surface, referenced generally at 14, of the pad 10 being disposable in conductive heat transfer contact or adjacency with the other of the heat transfer surfaces.

Pad 10 may be provided in the form of, or as formed from, such as by die or kiss-cutting, a sheet, roll, tape, or the like. In basic composition, pad 10 is formed of a layer, 20, of a thermally-conductive compound formulated in accordance with the precepts of the present invention, which layer 20 forms the surfaces 12 and 14 of the pad 10, and which layer 20 is compliant or otherwise conformable between the heat transfer surfaces of the thermal management assembly. For most applications, compound layer 20 will have thickness, referenced at "t" in FIG. 2, of about 5 mils (125 $\mu$m) or less and not greater than about 20 mils (510 $\mu$m), and will exhibit a thermal impedance, such as in accordance with ASTM D5470, of between about 0.01–0.02° C.-in$^2$/W (0.065–0.13° C.-cm$^2$/W), and a thermal conductivity, such as also in accordance with ASTM D5470, of at least about 0.7 W/m-K.

Figure 3:
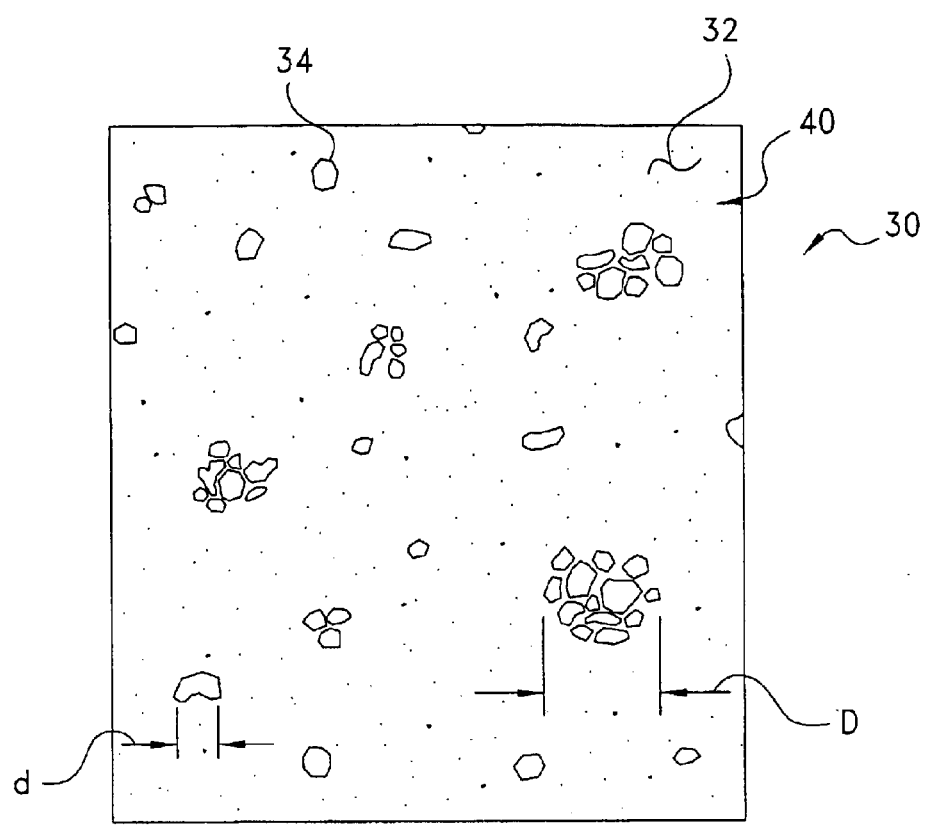
FIG. 3 is a depiction showing the morphology of the thermal compound forming the conformable layer of the thermal interface pad interface of FIG. 1.

In accordance with the present invention, the thermally-conductive compound of the conformable layer 20 is formulated, with reference momentarily to the somewhat stylized morphological, i.e., photomicrographical, depiction of layer 20 which is referenced at 30 in FIG. 3, as a blend or other admixture of a continuous phase component or other constituent which forms a generally continuous matrix phase, 32, in layer 20, and a dispersed phase component or other constituent which forms generally discrete domains, one of which is referenced at 34, within the matrix phase 32.

The continuous phase component be provided as what is generally termed a thermal grease or paste, with the term "thermal grease" herein being adopted and used interchangeably with the term "thermal paste." Depending upon its viscosity (absolute or intrinsic) which may range between about 10,000–300,000 cp (10–300 Pa-s), such non-curing grease may be generally form-stable or gel-like, i.e., non-running, slumping, or sagging at normal room temperature (between about 25–30° C.), but otherwise may be semi-solid, semi-liquid, or otherwise viscous or viscoelastic and/or thixotropic.

Particularly, the thermal grease may be oil-based, and more particularly based on a mineral or hydrocarbon oil, a synthetic oil such as a glyceride, or, preferably, a silicone oil or, as commonly termed, "silicone fluid," which may be an organosiloxane, or a blend of one or more of any of the aforementioned. The grease may be formulated to be inherently tacky or sticky to enable one or both of the surfaces 12 and 14 of the layer 20 to adhere, such as by means of surface tension, at room temperature under a low applied pressures of about 5 psi (35 kPa) or less to the surface of the heat sink, spreader, or the like.

Additional fillers and additives may be included in the thermal grease compound depending upon the requirements of the particular application envisioned. Such fillers and additives, which may be compounded with the oil component in a conventional mixing apparatus, may include conventional wetting agents or surfactants, opacifying or antifoaming agents, chain extending oils, tackifiers, pigments, lubricants, stabilizers, flame retardants such as decabromodiphenyl oxide, antioxidants, thermally-conductive fillers, stabilizers, dispersants, flow modifiers, tackifiers, film-reinforcing polymers and other agents, and inert fillers such as fumed silica.

For optimal thermal performance, the oil component may be compounded with a conventional thermally-conductive particulate filler, particles of such filler being represented at 40 in the view 30 of FIG. 3. The filler typically will be included within the oil component in a proportion sufficient to assist in providing the thermal conductivity desired for the intended application, and generally will be loaded at between about 20–80% by total weight of the oil component and filler. The size and shape of the filler is not necessarily critical for the purposes of the present invention. In this regard, the filler may be of any general shape including spherical, flake, platelet, irregular, or fibrous, such as chopped or milled fibers, but preferably will be a powder or other particulate to assure uniform dispersal and homogeneous mechanical and thermal properties. The particle size or distribution of the filler typically will range from between about 0.01–10 mil (0.25–250 $\mu$m), but may further vary depending upon the thickness of layer 20. Suitable thermally-conductive fillers, which may be either electrically-conductive or nonconductive, include boron nitride, titanium diboride, aluminum nitride, silicon carbide, graphite, metals such as silver, aluminum, and copper, metal oxides such as aluminum oxide, magnesium oxide, zinc oxide, beryllium oxide, and antimony oxide, and mixtures thereof. Such fillers characteristically exhibit a thermal conductivity of about 25–50 W/m-K. For reasons of economy, an aluminum oxide, i.e., alumina, or zinc oxide may be used, while for reasons of improved thermal conductivity a boron nitride would be considered more preferred, although a combination of one or more oxides and boron nitride may be used as a compromise. Loaded with the thermally-conductive filler, the thermal grease itself typically will exhibit a thermal conductivity, per ASTM D5470, of between about 0.1–5 W/m-K and a thermal impedance, also per ASTM D5470, of less than about 1° C.-in$^2$/W (6° C.-cm$^2$/W). As admixed with the filler, the silicon or other oil component generally forms a binder into which the filler particles are dispersed.

The dispersed component forming the domains 34 is phase or state changing in being selected to be form-stable at normal room temperature, i.e., about 25° C., in a solid, semi-solid, glassy, or crystalline first phase or state, but as substantially conformable at an elevated temperature or temperature range in a liquid, semi-liquid, or otherwise viscous second phase or state. The phase transition temperature of the dispersed phase component, which may be its melting temperature from a form stable first phase to a flowable second phase, is preferably between about 40–80° C., and may be tailored to fall within the operating temperature of most electronic components.

The dispersed phase component forming the domains 34 may be resin or other polymeric-based PCM, but for optimal thermal performance is provided to be a fusible, i.e., low melting point, metal or metal alloy of the type which is commonly used as solders and thermal links or fuses. Particularly, the dispersed phase may be one or more of such fusible metals, one or more of such fusible metal alloys, or a mixture or other combination of one or more fusible metals and one or more fusible metal alloys. Such metals and alloys typically have melting points, or melting ranges such as from a solidus temperature to a liquidus temperature, of between about 50–260° C. (124–500° F.), and usually contain one or more of bismuth, lead, tin, cadmium, and indium, but also may one or more other metals such as silver, zinc, copper, and antimony. Often, a eutectic alloy is formulated of a mixture of such metals, such eutectic having a definite melting point which may be lower in than that of each of the constituents of the mixture.

Representative fusible metals and metal alloys for the dispersed phase component include ASTM Alloy 117 and, particularly, lead and cadmium-free alloys of bismuth, tin, and indium having a melting point of about 141° F. (61° C.). A particularly preferred alloy having a melting point of 141° F. (61° C.) is a eutectic of 32.5% bismuth, 16.5% tin, and 50% indium.

The fusible metals and metal alloys are included within the thermal grease or other polymeric constituent in a proportion sufficient to provide the thermal conductivity desired for the intended application, and generally will be loaded at between about 5-25% by total weight of the thermally-conductive compound, i.e., the thermal grease, including any admixed thermally conductive filler and other additives, and the metal or metal alloy. As shown in FIG. 3, within the continuous phase of the thermal grease 32, the fusible metals and/or metal alloys form the discrete domains 34 which are co-dispersed with the filler component 40 of the grease. Typically, the domains 34 will have a diametric or other extent, referenced at "d" in FIG. 3, of between about 0.4–3 mils (10–75 $\mu$m) and, depend upon the degree of dispersion within the matrix 32, such domains 34 may form agglomerations having an extent, referenced at "D," of up to about 3 mils (75 $\mu$m) or more. As used herein, the term "discrete domains" should be understood to refer to either such domains individually or to the agglomerations thereof.

Following the heating of the layer 20 to a temperature which is above the phase transition temperature of the fusible metal or alloy, the domains 34 may form an emulsion with the matrix phase 32. Advantageously, however, by virtue of the thermal grease matrix, the viscosity (absolute or intrinsic) of the emulsified compound may be maintained to be, for example, between about 10,000–300,000 cp (10–300 Pa-s) within the operating temperature range of the electronic component involved, or otherwise between about 40–80° C., such that the emulsion is sufficiently viscous to remain in the bondline. Moreover, it has been observed that the addition of alumina, boron nitride, or other thermally-conductive filler particles to the formulation, although not necessarily required, provides optimal thermal performance in that the filler particles 40 may function as a thermal bridge between the domains 34 of the dispersed phase component giving the apparent effect of domain to domain contact along a thermal path or network. Such filler particles also can be used to modify the viscosity, and hence to control the flow, of the compound.

Returning to FIGS. 1 and 2, in the production of commercial quantities of pad 10, the thermally-conductive compound of layer 20 may be compounded as an admixture of the thermal grease, as may be filled with thermally-conductive particulate fillers, and the dispersed phase component under conditions of high shear in a roll mill or other mixer. In the case of the dispersed phase component being incorporated as one or more fusible metals and/or metal alloys, the metals and alloys may be introduced in the form of a bar, rod, ingot, pellet, powder, or the like, and admixed with the thermal grease under conditions of elevated temperature which exceed at least the phase transition temperature of the metals and alloys. In the case of a powder, the fusible metal in whatever form provided, first may be milled or otherwise ground or comminuted to effect a powder having a desired particle size or distribution, which powder then may be incorporated into the thermal grease component at either elevated or ambient temperatures.

After compounding, the admixture may be thinned with a solvent or other diluent. Thereafter, a layer 20 of the compound may be coated on a release liner or other carrier strip or sheet, such as the liner referenced at 42 in FIGS. 1 and 2, in a conventional manner such as by, for example, spraying, knife coating, roller coating, casting, drum coating, dipping, dispensing, extrusion, screen printing, or other direct process, or by a transfer or other indirect process. After coating, the resultant layer 20 may be dried to flash the solvent to develop an adherent film, coating, or other residue of the layer 20 on the release liner 42. As a result of the inherent tack of the thermal grease or the flow thereof, an adhesive and/or mechanical bond may be developed between the layer 20 and the liner 42.

Although not required, a carrier or reinforcement member, referenced at 43 in FIG. 2, optionally may be incorporated within layer 20 as an interlayer therewithin, as shown, or alternatively on one or both of the surfaces 12 and 14 to provide increased tear resistance. In either arrangement, the member 43 may be formed as having interstices or holes within which the thermally-conductive compound may be impregnated otherwise carried. Particularly, such member 43 may be provided as a film formed of a thermoplastic material such as a polyimide or polyetheretherketone (PEEK), a layer of a woven or non-woven, e.g., needled, fiberglass fabric, cloth, web, or mat, or an aluminum or other metal foil, screen, or expanded mesh. In addition to functioning as a carrier for the compound, the reinforcement also may be used to improve the physical strength of the layer 20 and pad 10 to better facilitate handling at higher ambient temperatures and die cutting into a variety of geometries. The reinforcement member typically will have a thickness of between about 0.5–5 mil (12.5–125 $\mu$m), with a thickness of about 1–2 mils (25–50 $\mu$m) being preferred for metal foils.

With continuing reference to FIGS. 1 and 2, as mentioned, layer 20 may be formed on a release liner 42 which thereupon covers the surface 14 of the layer. For ease of handling and/or as a protective layer for shipping, a second release liner, 44, may be laminated or provided over the other surface 12 of layer 20. Exemplary materials for either or both of the liners 42 and 44 include face stocks or other films of polyolefins, plasticized polyvinyl chloride, polyesters, cellulosics, metal foils, composites, and waxed, siliconized, or other coated paper or plastic having a relatively low surface energy to be removable without appreciable lifting of the layer 20 from the other liner or the substrate to which the layer may be applied. Depending upon the intended application and method of dispensing such as by pick-and-place or other automated dispensing means, kiss-cut pads 10, or continuous lengths of layer 20, may be carried, with or without covering liner 44, on a sheet or tape of liner 42, and supplied in the form of a sheet or roll. Alternatively, individual pads 10 may be die-cut from sheets of liner 42, again with or without liner 44.

Alternatively, the layer 20 may be formed by coating or other dispensing a substrate other than a liner, such as directly on one of the heat transfer surfaces. In this regard, the viscosity of compound may be controlled or adjusted, such as by means of the filler loading level, the selection of the thermal grease, and/or the addition of solvents or other diluents, to accommodate the equipment or process to be employed for the application involved. For dispensing applications, the compound may charged into individual tubes, cartridges, or containers and stored for later application using, for example, a hand-held applicator gun or syringe, or, alternatively, automated metering and dispensing equipment such as a robotic applicator.

Figure 4:
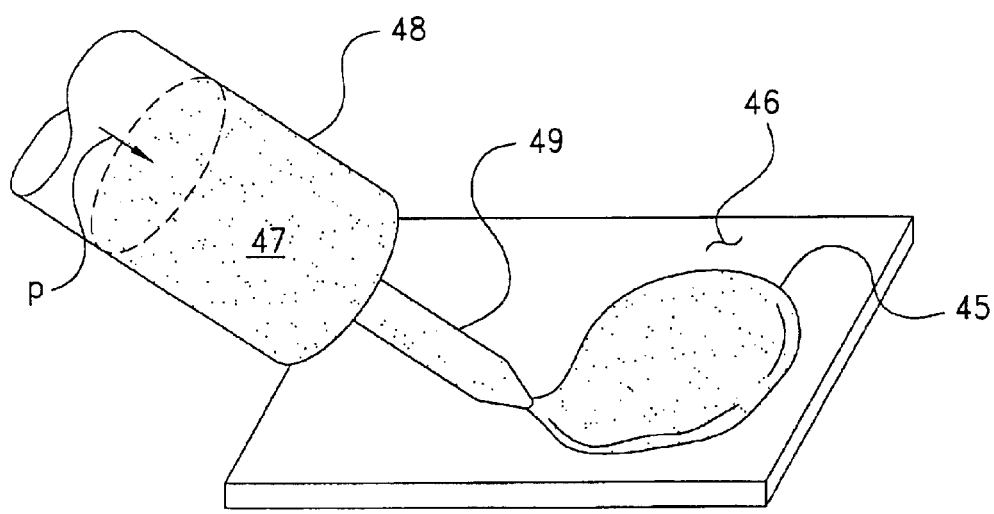
FIG. 4 is a perspective, somewhat schematic view of a representative application of the thermally-conductive compound of the present invention as dispensed onto a surface.

Looking now to FIG. 4, a mass or "blob," 45, of the compound is shown as being dispensed under an applied pressure, illustrated by the arrow designated "P," onto a primed or unprimed surface, 46, which may be a plastic, metal, or ceramic surface of, for example, a heat sink, cold plate, circuit board, housing part, or electronic component. In this regard, a supply of the compound, referenced at 47, is shown to be charged as a one-part system into a cartridge, tube, or other container, 48, connected in fluid communication, which may be directly as shown or via hose or other conduit connected to a nozzle, 49.

Under the applied pressure P, which may be manually applied using a gun or syringe, or developed by air or airless metering equipment such as a proportioning cylinder or a pump, a metered amount of the compound may be issued from nozzle 49 and onto the surface 46. As applied, the mass 45 may be substantially self-adherent to the surface 46, such as by surface tension, an inherent tack, or other adhesive force. As with the layer 20, the mass 45 advantageously may be form-stable at normal room temperature such that the part or component to which it is applied may be handled for assembly or otherwise. Alternatively, the mass 45 may be runny or otherwise non-form stable and may be contained on the surface via a dam or other barrier (not shown). The compound forming the mass 45 also may be injected directly into a gap (such as gap 72 shown in FIG. 6) maintained between the surface 46 and an opposing surface (surfaces 80 and 82 in FIG. 6) such as via an opening (referenced at 50 in FIG. 6) provided through one of the surfaces.

Figure 5:
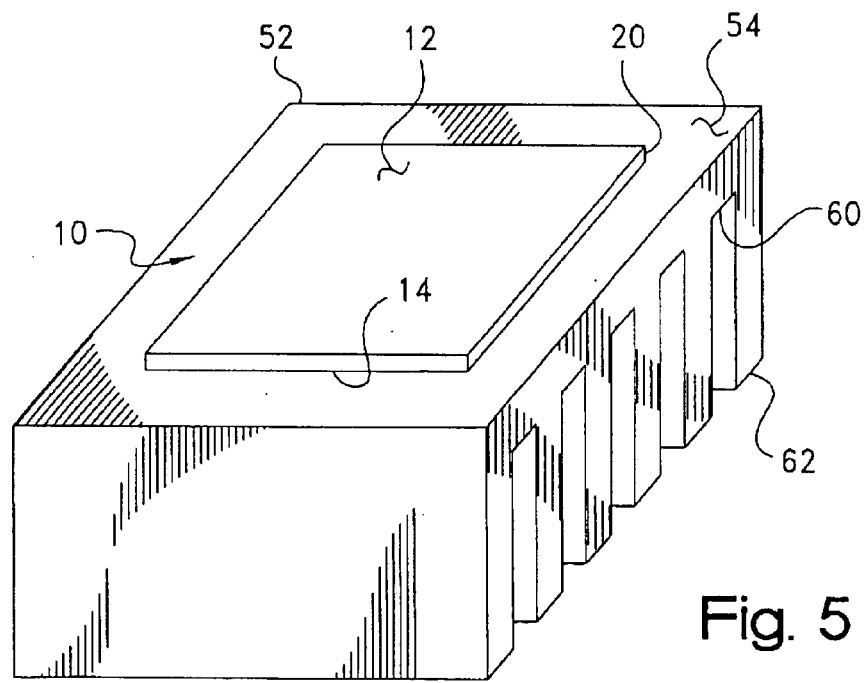
FIG. 5 is a perspective view showing the thermal interface of FIG. 1 as bonded to a plate-fin heat sink for use in a representative thermal management assembly.
Figure 6:
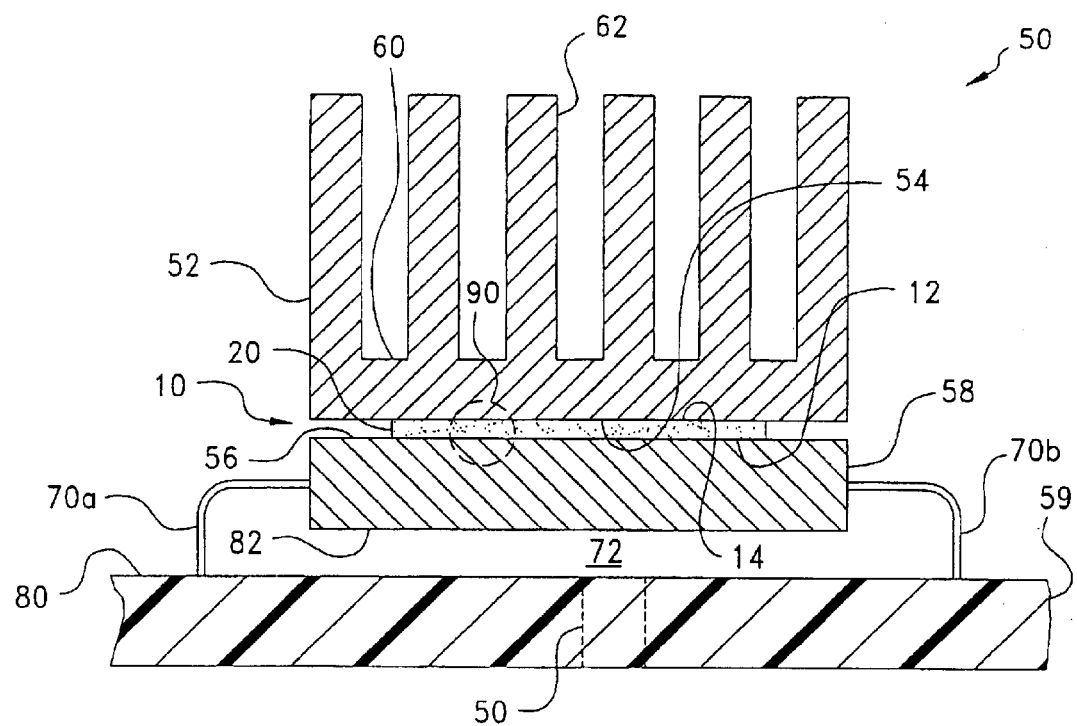
FIG. 6 is a cross-sectional view of a representative thermal management assembly wherein the heat sink and interface of FIG. 5 are disposed in heat transfer adjacency with a heat generating electronic component with the interface being interposed in conductive heat transfer contact with the heat sink and component to provide a low thermal impedance pathway therebetween.

Turning next to FIGS. 5 and 6, the use of pad 10 of FIGS. 1 and 2 (or the mass 45 of FIG. 4) is illustrated in connection with the thermal management assembly referenced generally at 51 in FIG. 5 which includes a thermal dissipation member, 52, having a heat transfer surface, 54, which is disposed in conductive heat transfer adjacency with an opposing heat transfer surface, 56, of a heat-generating analog, digital, or other electronic component, 58, supported on an associated printed circuit board (PCB) or other substrate, 59. For illustrative purposes, thermal dissipation member 52 is shown to be a heat sink which may be of a plate-fin variety having a generally planar base portion, 60, from which extends a plurality of cooling fins, one of which is referenced at 62. Alternatively, thermal dissipation member 52 may be provided as a pin fin or other heat sink, heat exchanger, cold plate, or heat spreader structure, or even a printed circuit board, housing, or chassis. Dissipation member 52 typically will be formed of a ceramic material such as alumina, or a metal material such as aluminum or copper having a heat capacity relative to that of component 58 to be effective is dissipating thermal energy conducted or otherwise transferred therefrom.

With continuing reference to FIG. 5, electronic component 58 may be an integrated microchip, microprocessor, transistor, or other power semiconductor device, an ohmic or other heat-generating subassembly such as a diode, relay, resistor, transformer, amplifier, diac, or capacitor, or, alternatively, another heat-generating source. Typically, component 58 will have an operating temperature range of from about 60–100° C. For the electrical connection of component 58 to board 59, one or more pair of solder balls, leads, or pins, one pair of which is referenced at 70a–b, are provided as extending from component 58 into a soldered or other connection with board 59. Leads 70 additionally may support component 58 above board 59 to define a gap, represented at 72, of about 3 mils (75 microns) therebetween. Alternatively, component 58 may be received directly on board 59.

Returning momentarily to FIGS. 2 and 4, with pad 10 of FIG. 2 removed from the liner 42 to expose the surface 14 of layer 20, pad 10 may be bonded or otherwise attached to the heat transfer surface 54 of the dissipation member 52. In this regard, and as aforementioned, pad 10 may be die or kiss-cut or otherwise sized from a larger sheet or from a roll or other length of tape stock. Typically, the margins of the applied pad 10 will be sized smaller than the area of the surface 54 or other surface to which the pad is applied to accommodate for an increase in the surface area coverage of the pad as the thickness thereof decreases under an applied pressure in the conformable phase of the layer 20. Alternatively, the compound may be dispensed onto the surface as the mass 45 as was described in connection with FIG. 4.

With the applied pad 10, dissipation member 52 may be packaged and shipped, with the liner 44 covering the other surface 12 of the pad 10, as an integrated unit to an electronics manufacturer, assembler, or other user. The user then simply may remove the liner 44 to expose the surface 12 of layer 20, position the exposed surface 12 on the heat transfer surface 56 of electronic component 58, and, lastly, apply a clip, clamp, screw, or other another means of external pressure (not shown) to dispose the dissipation member 52 in thermal adjacency with the component 58 as is shown in FIG. 6.

With continuing reference to FIG. 6, within assembly 51, pad 10 provides a low impedance conductive pathway for the transfer of heat from component 58 to dissipation member 52. Such pathway may be employed without or in conjunction with convective air circulation for effecting the cooling of component 58 and ensuring that the operating temperature thereof is maintained below specified limits. Although thermal dissipation member 52 is shown to be a separate heat sink member, board 59 itself may be used for such purpose by alternatively interposing pad 10 within the gap 72 between an upper surface, 80, of the board 59 thereof and an opposing surface, 82, of the electronic component 58.

As mentioned, the thermally-conductive compound of layer 20 may be formulated to be form-stable at normal room temperature, i.e., about 25° C., in a first phase of the fusible metal and/or metal alloy constituents, which is solid, semi-solid, glassy, or crystalline, but to be substantially conformable in service in a second phase thereof, which second phase may be a liquid, semi-liquid, or otherwise viscous emulsion, between the heat transfer surfaces 54 and 56. More specifically, the phase transition temperature of the fusible metals and/or alloys is preferably between about 40–80° C., and generally is tailored to fall within the operating temperature of electronic component 58.

Figures 7A, 7B:
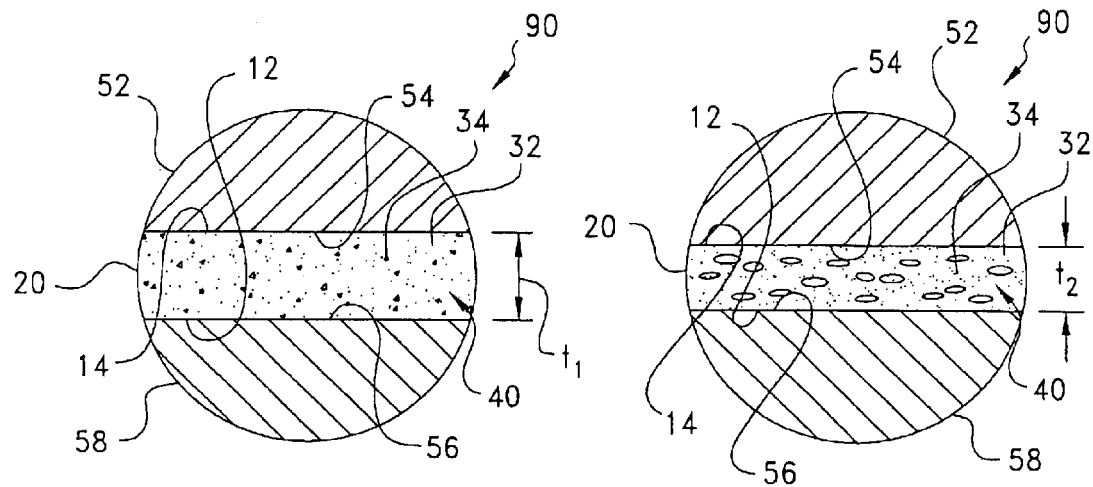
FIG. 7A is a magnified view of a portion of the interface pad of FIG. 6 showing the morphology thereof prior to phase change in enhanced detail.
FIG. 7B is a magnified view as in FIG. 7B showing the morphology the interface pad of FIG. 5 after phase change.
Figure 8:
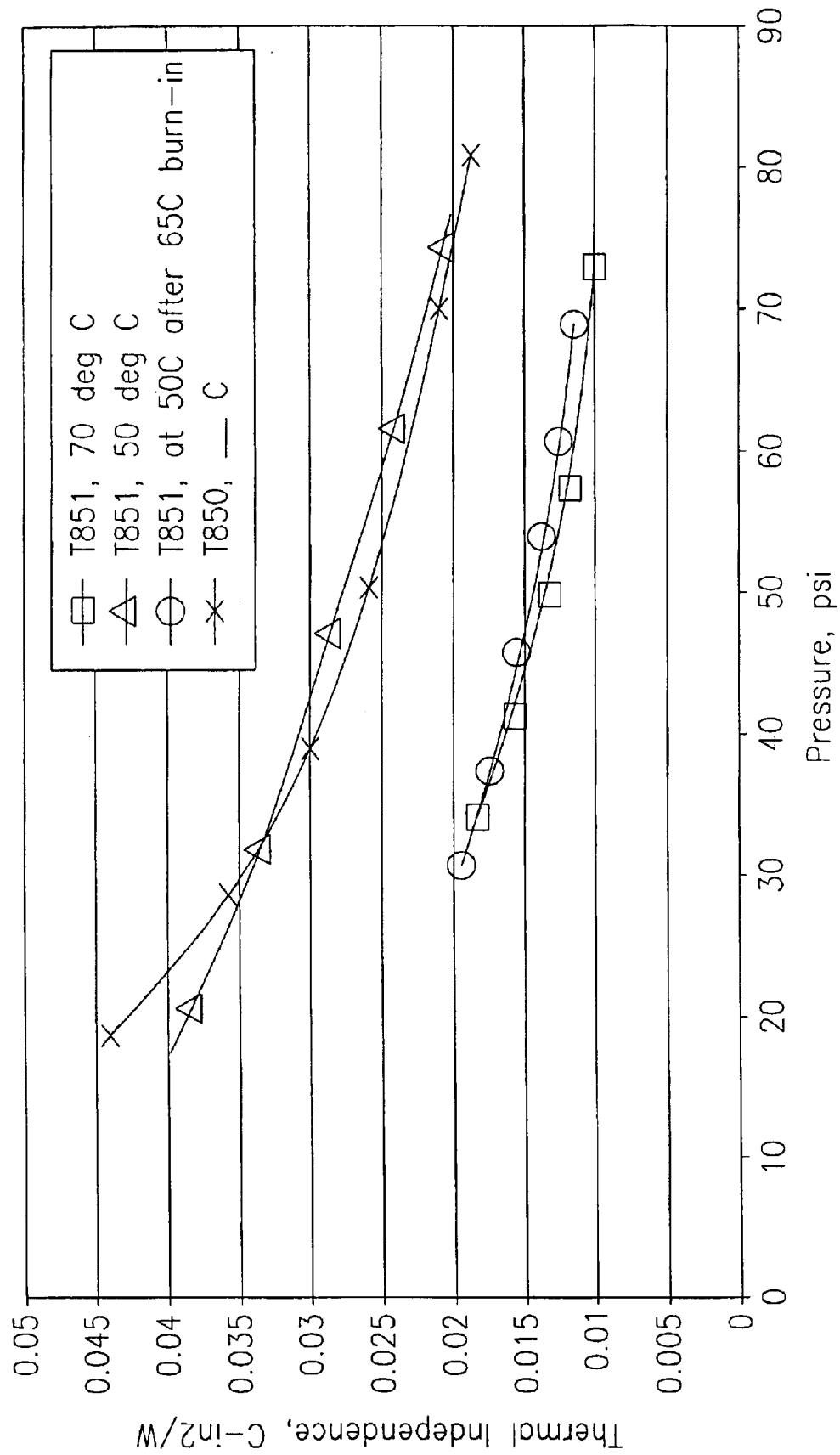
FIG. 8 is a plot of thermal impedance versus pressure for a representative formulation of the thermally-conductive compound of the present invention, and as compared to a standard thermal grease.

Turing now to FIG. 7A, an enlarged view of the region referenced at 90 in FIG. 5 is shown to detail the morphology thereof prior to heating by the energization of electronic component 58. As may be seen, prior to heating, the bond-line between the heat transfer surfaces 54 and 56 defines a first MBLT, referenced at $t_1$, which may be substantially filled by the layer 20 of the thermal compound of pad 10 of the present invention. Advantageously, by virtue of the use of the thermal grease component, a relatively thin thickness $t_1$ of about 1 mil (25 µm) or less, and a correspondingly low thermal impedance, may be effected at room temperature and under a relative low given applied pressure, for example, a pressure of about 1 psi (6 kPa) or less.

With reference next to the depiction at 90' shown in FIG. 7B, upon heating and the resultant phase change of the dispersed domains 34 into their conformable second phases, which phases may form an emulsion with the thermal grease component of the matrix phase 32, an even thinner MBLT, now referenced at $t_2$, between the surfaces 54 and 56 may be achieved. The thickness $t_2$ may be reduced, such as under the continuing application of the given applied external pressure which may be developed from a spring clip or the like, by about 20–50% or more as compared to the thickness $t_1$, with a corresponding increase in the surface area of pad 10 which thereby may flow to substantially fill the margins of the bondline gap between the surfaces 54 and 56, and a correspondingly decreased thermal impedance.

The Examples to follow, wherein all percentages and proportions are by weight unless otherwise expressly indicated, are illustrative of the practicing of the invention herein involved, but should not be construed in any limiting sense.

EXAMPLES

Example 1

In representatives formulations of the thermally-conductive compound of the present invention were prepared by admixing a fusible metal ASTM Alloy 117 in a boron nitride (BN) and zinc oxide-filled, silicone-oil based thermal grease (DC 340™, Dow Corning Corp., Midland, Mich.) having a reported thermal conductivity of $2.0 \times 10^{-3}$ cal/s-cm-° C. Such 117 alloys are specified per ASTM B774 as eutectics having a melting point of 117° F. (47° C.) and comprising between 44.2–45.2% bismuth, 22.1–23.2% lead, 7.8–8.8% tin, 18.6–19.6% indium, and 4.8–5.8% cadmium. The specific low metal alloy ("LMA") used in this Example 1 was a 44.7% bismuth, 22.6% lead, 8.3% tin, 19.1% indium, and 5.3% cadmium powder (AIM47™, AIM, Montreal, Quebec, Canada) having a average particle size of about 0.04–40 mils (1–1000 μm) This alloy was reported as having a an apparent thermal conductivity of about 20 W/m-K.

Samples of the thermal grease-alloy admixture were compounded at loading levels of 0, 5, 10, 15 and 20% of the alloy filler, with the 0% level being neat DC 340™ thermal grease for purposes of comparison. It was observed upon mixing that the viscosity of the thermal grease, which was believed to be between about 20,000–30,000 cp (20–30 Pa-s), was sufficient to blend easily with the powder of the alloy, and to maintain the powder in suspension after blending.

The thermal impedances of the samples were determined according to ASTM D5470 under an applied pressure of 50 psi (300 kPa) and at a minimum bondline thickness (MBLT) of less than about 1 mil (25 μm). The results obtained are reported in Table 1 below.

TABLE 1

| | Thermal Impedance | |
|---|---|---|
| Sample (% LMA) | ° C.-in²/W | ° C.-cm²/W |
| 0 | 0.36 | 9.0 |
| 5 | 0.019 | 0.48 |
| 10 | 0.010 | 0.25 |
| 15 | 0.010 | 0.25 |
| 20 | 0.008 | 0.20 |

The data of Table 1 show that that a thermal grease-LMA compound formulated according to the present invention exhibits improved thermal performance over the unfilled grease.

Example 2

The thermal performance of a 15% LMA-thermal grease compound formulated as described in connection with Example 1 was further characterized by measuring impedance as a function of pressure at 70° C., 50°, and at 50° C. following a burn-in at 65° C. The measurements were obtained in accordance with ASTM 5470, and are plotted in FIG. 7 as "T851." The results for the neat DC 340™ grease at 70° C. are also plotted in FIG. 7 as "T850." The result show an appreciable drop in impedance as a function of temperature for the LMA-filled sample versus the neat grease.

As it is anticipated that certain changes may be made in the present invention without departing from the precepts herein involved, it is intended that all matter contained in the foregoing description shall be interpreted as illustrative and not in a limiting sense. All references including any priority documents cited herein are expressly incorporated by reference.

What is claimed is:

1. A thermal management assembly comprising:
a first heat transfer surface having a first area;
a second heat transfer surface having a second area and opposing said first heat transfer surface; and
a thermally-conductive interface interposed intermediate the first and said second heat transfer surface to provide a thermally-conductive pathway therebetween, the interface having margins smaller than the first and the second area and comprising a thermally-conductive compound formed into a layer which is conformable between the first and second heat transfer surface, the compound comprising an admixture of:
(a) a thermal grease component; and
(b) a dispersed component forming discrete domains within the thermal grease component, the domains being form-stable at normal room temperature in a first phase and conformable between the first and second heat transfer surface in a second phase, and the domains having a transition temperature above normal room temperature from the first phase to the second phases,
wherein the layer has a thickness of about 5 mils (125 μm) or less at about room temperature under a given applied pressure, the thickness decreasing by at least about 20% under the given applied pressure within the operating temperature range of the heat-generating source.

2. The assembly of claim 1, wherein the domains have a mean average size of between about 0.4–3 mils (10–75μm).

3. The assembly of claim 1 wherein the thermal grease component comprises one or more silicone oils.

4. The assembly of claim 1 wherein the thermal grease component comprises one or more organosiloxane oils.

5. The assembly of claim 1 wherein the layer has a thermal impedance of less than about 1° C.-in²/W (6° C.-cm²/W).

6. The assembly of claim 1 wherein the compound has a thermal conductivity of at least about 0.5 W/m-K.

7. The assembly of claim 1 wherein the compound is substantially self-adherent to one or both of the first and the second heat transfer surface.

8. The assembly of claim 1 wherein the dispersed component comprises one or more fusible metals, one or more fusible metal alloys, or a combination thereof.

9. The assembly of claim 8 wherein the one or more fusible metals or alloys comprises one or more of bismuth, tin, lead, cadmium, and indium.

10. The assembly of claim 8 wherein the dispersed constituent comprises a eutectic alloy, by weight thereof, of about 32.5% bismuth, 16.5% tin, and 50% indium.

11. The assembly of claim 8 wherein the compound comprises, by total weight thereof, between about 5–25% of the one or more fusible metals or metal alloys or combination thereof.

12. The assembly of claim 8 wherein the domain transition temperature is between about 40–80° C.

13. The assembly of claim 12 wherein the dispersed constituent comprises one or more fusible metals, one or more fusible metal alloys, or a combination thereof.

14. The assembly of claim 8 wherein:
the first heat transfer surface is located on a heat-generating source having an operating temperature range above normal room temperature; and
the domain transition temperature is within the operating temperature range the heat-generating source.

15. The assembly of claim 1 wherein the domains in the second phase form an emulsion with the thermal grease component.

16. The assembly of claim 15 wherein the emulsion has a viscosity of between about 10,000–300,000 cp (10–300 Pa-s).

17. The assembly of claim 1 wherein:
the first heat transfer surface is located on a heat-generating source having an operating temperature range above normal room temperature; and
the transition temperature of the domains is within the operating temperature range the heat-generating source.

18. The assembly of claim 17 wherein:
the heat-generating source is an electronic component; and
the second heat transfer surface is located on a thermal dissipation member.

19. The assembly of claim 18 wherein the thermal dissipation member is a heat sink or a circuit board.

20. The assembly of claim 18 wherein the operating temperature of the heat-generating source is between about 40–80° C.

21. The assembly of claim 1 wherein the thermal grease component comprises one or more oils selected from the group consisting of mineral oils, hydrocarbon oils, synthetic oils, and silicone oils, and combinations thereof.

22. The assembly of claim 21 wherein the thermal grease component further comprises a thermally-conductive particulate filler.

23. The assembly of claim 22 wherein the dispersed constituent comprises one or more fusible metals, one or more fusible metal alloys, or a combination thereof.

24. The assembly of claim 22 wherein the filler is selected from the group consisting of metal or non-metal oxides, nitrides, carbides, or diboride particles, graphite particles, metal particles, and combinations thereof.

25. The assembly of claim 22 wherein the thermal grease component comprises between about 20–80% by weight of the filler.

26. The assembly of claim 22 wherein the particulate filler has a particle size of between about 0.01–10 mil (0.25–250 μm).

27. The assembly of claim 22 wherein the filler has a thermal conductivity of at least about 20 W/m-K.

28. The assembly of claim 22 wherein the thermal grease has a viscosity of between about 10,000–300,000 cp (10–300 Pa-s) at about room temperature.

* * * * *